(12) United States Patent
Hao et al.

(10) Patent No.: US 10,681,824 B1
(45) Date of Patent: Jun. 9, 2020

(54) WATERPROOF CIRCUIT BOARD AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Jian-Yi Hao, Shenzhen (CN); Yan-Lu Li, Shenzhen (CN); Xian-Qin Hu, Shenzhen (CN); Ming-Hua Du, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/705,398

(22) Filed: Dec. 6, 2019

(30) Foreign Application Priority Data

Sep. 24, 2019 (CN) .......................... 2019 1 0907094

(51) Int. Cl.
*H05K 3/46* (2006.01)
*H05K 1/02* (2006.01)
*H05K 3/28* (2006.01)
*H05K 3/12* (2006.01)

(52) U.S. Cl.
CPC ............. *H05K 3/4664* (2013.01); *H05K 1/02* (2013.01); *H05K 3/1258* (2013.01); *H05K 3/28* (2013.01); *H05K 2203/1377* (2013.01)

(58) Field of Classification Search
CPC ...... H05K 1/02; H05K 1/0213; H05K 1/0275; H05K 1/0284; H05K 3/38; H05K 3/386; H05K 3/387; H05K 3/4635; H05K 3/4644
See application file for complete search history.

(56) References Cited

U.S. PATENT DOCUMENTS

| | | | | |
|---|---|---|---|---|
| 2011/0051383 A1* | 3/2011 | Chen | ....................... | H04M 1/18 361/752 |
| 2011/0148746 A1* | 6/2011 | Devorris | .................. | G09G 3/14 345/82 |
| 2014/0036514 A1* | 2/2014 | Sawayanagi | ............ | F21V 27/02 362/368 |

* cited by examiner

*Primary Examiner* — Jeremy C Norris
(74) *Attorney, Agent, or Firm* — ScienBiziP, P.C.

(57) ABSTRACT

A method for manufacturing a waterproof circuit board comprises steps of providing a first wiring substrate suitable for high-frequency transmissions. The first wiring substrate includes a first copper layer and a first conductive wiring layer. A waterproof layer is formed on exposed surfaces of the first wiring substrate. A second wiring substrate suitable for low-frequency transmissions defines a receiving groove. The second wiring substrate includes a second copper layer and defines a first blind hole. The first wiring substrate is pressed in the receiving groove. A first conductive portion is formed in the first blind hole to electrically connect the first conductive wiring layer and the second copper layer.

19 Claims, 4 Drawing Sheets

WATERPROOF CIRCUIT BOARD AND METHOD FOR MANUFACTURING THE SAME

FIELD

The subject matter herein generally relates to manufacturing a circuit board which is waterproof

BACKGROUND

A flexible circuit board without a waterproof layer may absorb water during manufacturing and in use, as a result, the performance of the flexible circuit board may change from the original design. The flexible circuit board may not meet the requirements of high frequency communication.

BRIEF DESCRIPTION OF THE DRAWINGS

Implementations of the present technology will now be described, by way of embodiment, with reference to the attached figures.

DETAILED DESCRIPTION

Figure 1:
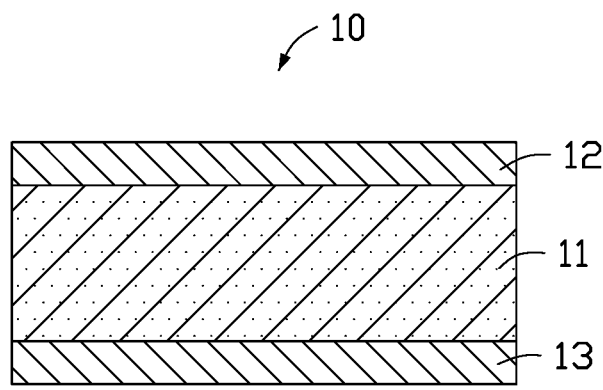
FIG. 1 is a schematic view of an embodiment of a copper-clad substrate for a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Referring to FIGS. 1 to 8, a method for manufacturing a waterproof circuit board 100 is presented in accordance with an example embodiment. The method for manufacturing the waterproof circuit board 100 is provided by way of example, as there are a variety of ways to carry out the method. The example method begins at step 1.

At step 1, referring to FIG. 1, a copper-clad substrate 10 is provided.

The copper-clad substrate 10 comprises a flexible first base layer 11 having a first copper layer 12 and a second copper layer 13 formed on the opposite surfaces of the first base layer 11. The first base layer 11 can be made of a material selected from a group consisting of polymide (PI), liquid crystal polymer (LCP), polyether-ether-ketone (PEEK), polyethylene terephthalate (PET), and polyethylene naphthalate (PEN). In one embodiment, the first base layer 11 is made of polymide.

Figure 2:
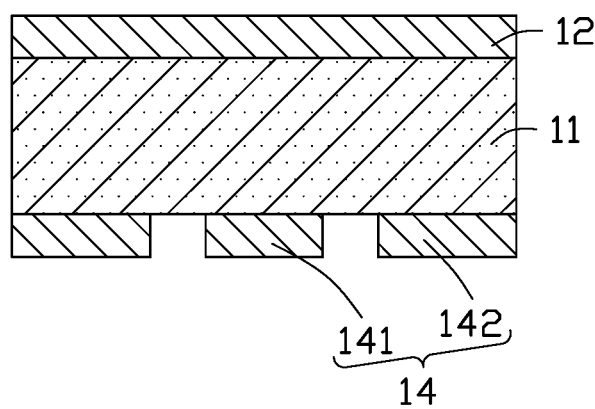
FIG. 2 is a diagram showing a second copper layer etched away to form a first conductive wiring layer in the circuit board of FIG. 1.

At step 2, referring to FIG. 2, the second copper layer 13 is etched to form a first conductive wiring layer 14.

The first conductive wiring layer 14 comprises a signal wire 141 and a ground wire 142 on two sides of the signal wire 141.

Figure 3:
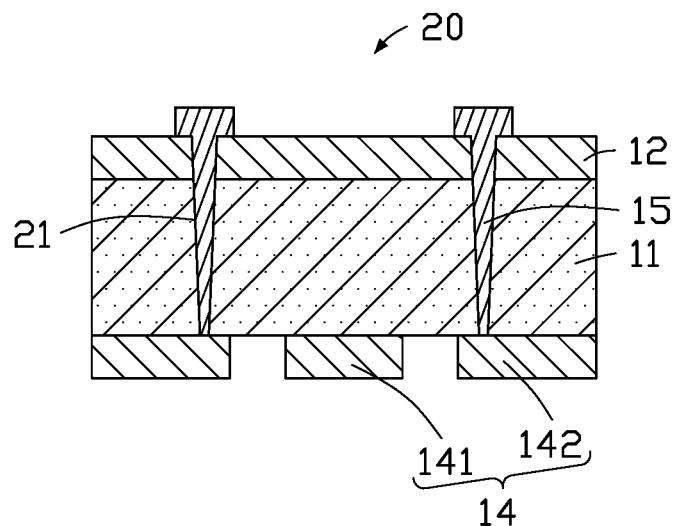
FIG. 3 is a diagram showing a first wiring substrate obtained by forming first conductive portions through the first copper layer and a first base layer in the circuit board of FIG. 2.

At step 3, referring to FIG. 3, at least one second blind hole 21 is defined on the copper-clad substrate 10.

The second blind hole 21 extends through the first copper layer 12 and the first base layer 11. The cross section of the second blind hole 21 can be substantially, but not limited to, cylindrical or rectangular. In one embodiment, the second blind hole 21 is formed by a laser drilling process. In an alternative embodiment, the second blind hole 21 can be formed by other methods, such as a mechanized drilling process.

At step 4, a first conductive material is infilled into the second blind hole 21 to form a second conductive portion 15, thereby obtaining a first wiring substrate 20.

The second conductive portion 15 electrically connects the first copper layer 12 and the first conductive wiring layer 14. In one embodiment, the second conductive portion 15 electrically connects the first copper layer 12 and the ground wire 142. The first conductive material can be conductive paste such as tin paste, or metal such as copper. An end of the second conductive portion 15 away from the first conductive wiring layer 14 protrudes out of the first copper layer 12.

Figure 4:
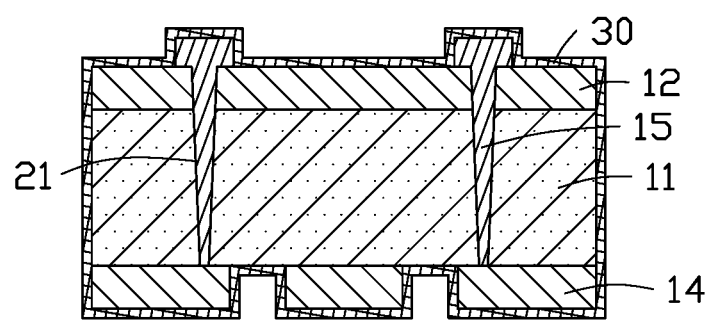
FIG. 4 is a diagram showing a waterproof layer covering the first wiring substrate in the circuit board of FIG. 3.

At step 5, referring to FIG. 4, a waterproof layer 30 is formed on surfaces of the first wiring substrate 20. The waterproof layer 30 covers exposed surfaces/outside surfaces of the first wiring substrate 20. That is, the waterproof layer 30 covers exposed surfaces of the first base layer 11, the first copper layer 12, the first conductive wiring layer 14, and the second conductive portion 15.

In an alternative embodiment, the waterproof layer 30 covers exposed surfaces of the first conductive wiring layer 14, thereby protecting the first conductive wiring layer 14 from moisture.

In other alternative embodiment, the waterproof layer 30 further covers exposed surfaces of the first base layer 11, the first copper layer 12, and the second conductive portion 15 protruding out of the first copper layer 12.

The waterproof layer 30 can be formed on the first wiring substrate 20 by a soaking process, a spraying process, or other process. The waterproof layer 30 is a nanometer-scale film, for example, which is made of a low viscosity solution containing 4% weight percent of fluorinated polymer dissolved in a hydrofluoroether solvent and detectable by ultraviolet light. In an alternative embodiment, a thickness of the waterproof layer 30 is about 180 nm to 360 nm.

Figure 5:
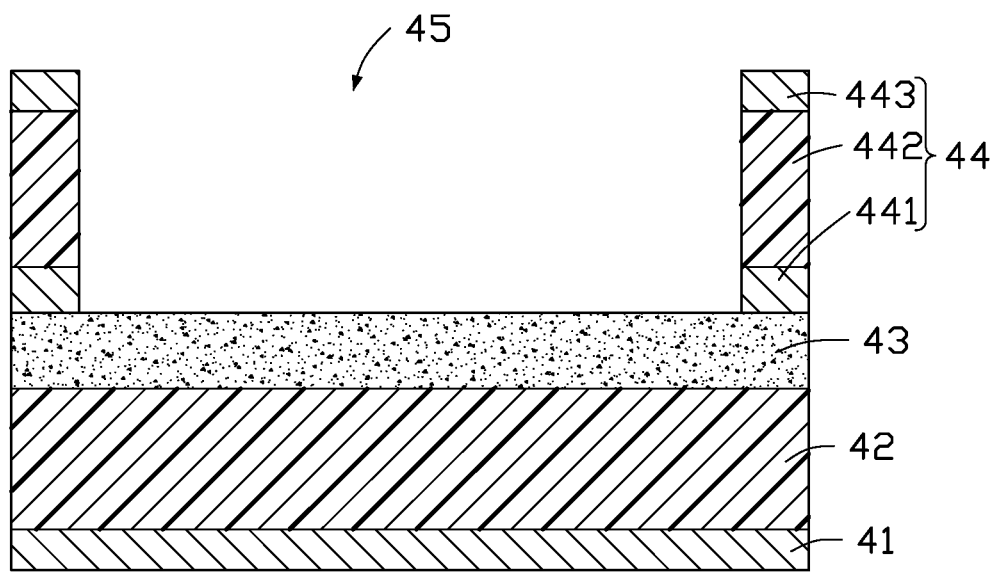
FIG. 5 is a schematic view of an embodiment of a second wiring substrate of the circuit board.

At step 6, referring to FIG. 5, a second wiring substrate 40 is provided.

The second wiring substrate 40 comprises a second copper layer 41, a first insulation layer 42, an adhesive layer 43, and a wiring unit 44 stacked in that order. The wiring unit 44 comprises a second conductive wiring layer 441 stacked on the adhesive layer 43, a second insulation layer 442, and a third conductive wiring layer 443 stacked in that order. The wiring unit 44 defines a receiving groove 45 extending through the third conductive wiring layer 443, the second insulation layer 442, and the second conductive wiring layer 441. The adhesive layer 43 is exposed at the receiving groove 45.

In an alternative embodiment, the quantity of the conductive wiring layers of the wiring unit 44 can be changed according to actual needs.

The adhesive layer 41 is made of a sticky resin, which can be selected from a group consisting of polypropylene, epoxy resin, polyurethane, phenolic resin, urea-formaldehyde resin, melamine-formaldehyde resin, polymid, and any combination thereof. The first insulation layer 42 and the second insulation layer 442 can be made of a material selected from a group consisting of polymide (PI), liquid crystal polymer (LCP), polyether-ether-ketone (PEEK), polyethylene terephthalate (PET), and polyethylene naphthalate (PEN).

In one embodiment, the first insulation layer 42 and the second insulation layer 442 are made of polymide.

Figure 6:
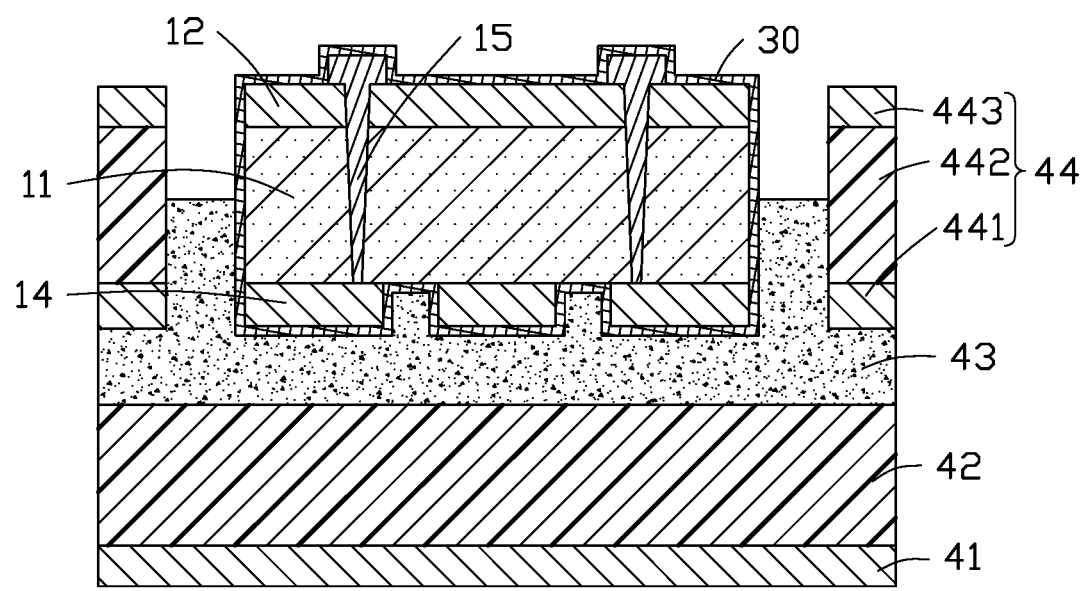
FIG. 6 is a diagram showing the first wiring substrate pressed into the second wiring substrate via a groove.

At step 7, referring to FIG. 6, the first wiring substrate 20 is placed and pressed in the receiving groove 45, thus the first wiring substrate 20 is adhered to the second wiring substrate 40 via the adhesive layer 43.

A shape of the first wiring substrate 20 matches shape of the receiving groove 45. After pressing the first wiring substrate 20, the first copper layer 12 is aligned with the third conductive wiring layer 443, the adhesive layer 43 also fills gaps between the second insulation layer 442 and the first base layer 11.

Figure 7:
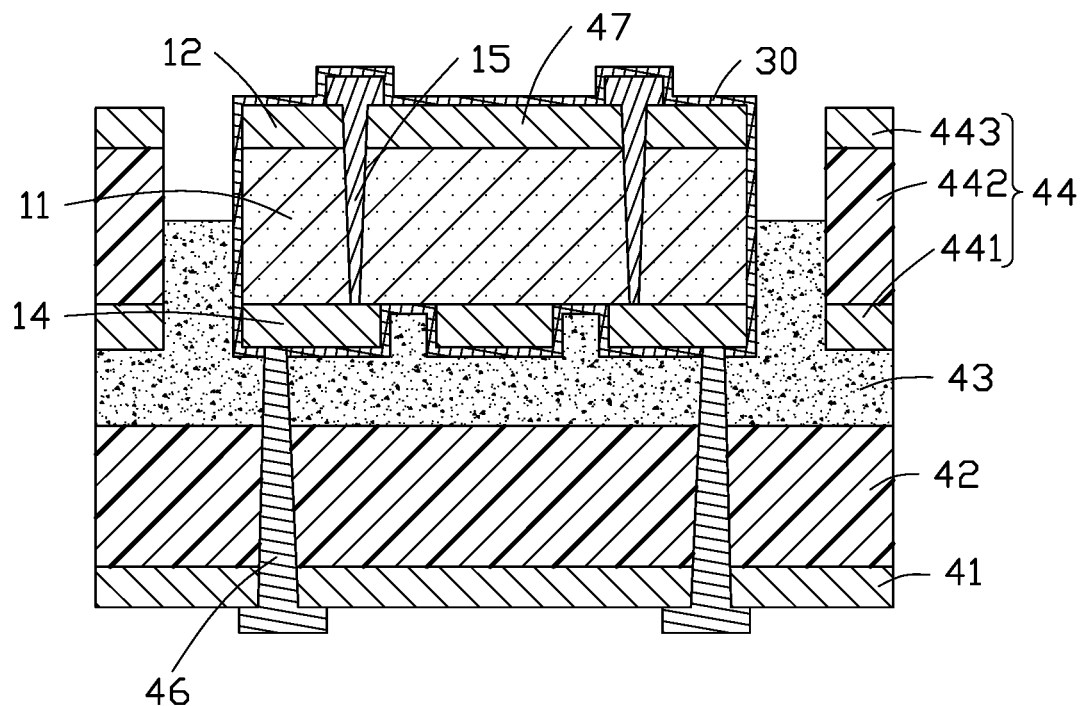
FIG. 7 is a diagram showing second conductive portions formed in the second wiring substrate.

At step 8, referring to FIG. 7, at least one first blind hole 61 is defined on the second wiring substrate 40.

The first blind hole 61 extends through the second copper layer 41, the first insulation layer 42, the adhesive layer 43, and a portion of the waterproof layer 30 on a side of the first conductive wiring layer 14 away from the first base layer 11. The cross section of the first blind hole 61 can be substantially, but not limited to, cylindrical or rectangular. In one embodiment, the first blind hole 61 is formed by a laser drilling process. In an alternative embodiment, the first blind hole can be formed by other methods, such as a mechanized drilling process.

At step 9, a second conductive material is infilled into the first blind hole 61 to form a first conductive portion 46.

The first conductive portion 46 electrically connects the first conductive wiring layer 14 and the second copper layer 41. In one embodiment, the first conductive portion 46 electrically connect the second copper layer 41 and the ground wire 142. The second conductive material can be conductive paste such as tin paste, or metal such as copper. An end of the first conductive portion 46 away from the adhesive layer 43 protrudes out of the second copper layer 41.

The first conductive portion 46 and the second conductive portions 15 are both electrically connected to the ground wire 142, thus the first copper layer 12, the first conductive portion 46, the second conductive portion 15, and the second copper layer 41 cooperatively form an electromagnetic shield 47. The signal wire 141 is within the electromagnetic shield 47, thereby being shielded against electromagnetic interference.

Figure 8:
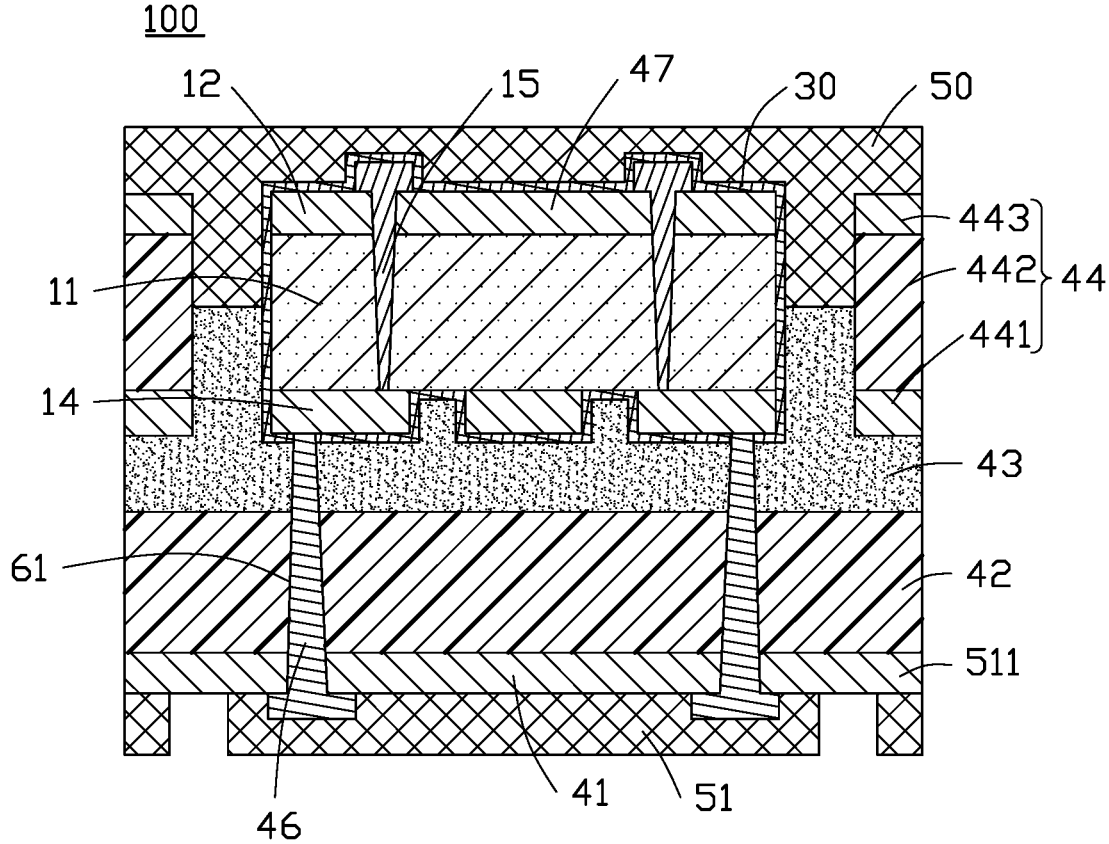
FIG. 8 is a diagram showing a first protective layer covering a waterproof layer and a third conductive wiring layer, a second protective layer covering the second copper layer of the circuit board.

At step 10, referring to FIG. 8, a first protection layer 50 is formed on a surface of a portion of the waterproof layer 30, which is on a side of the first copper layer 12 away from the first base layer 11, and a surface of the third conductive wiring layer 443. A second protection layer 51 is formed on a surface of the second copper layer 41 away from the adhesive layer 43, thereby obtaining the waterproof circuit board 100.

The first protection layer 50 also fills gaps between the second insulation layer 442 and the first base layer 11. The first protection layer 50 and the second protection layer 51 can be solder masks or covering layers.

A portion of the second copper layer 41 is exposed from the second protection layer 51 to form at least one solder pad 511, which is connected to an electronic element (not shown).

FIG. 8 illustrates an embodiment of a waterproof circuit board 100 comprising a first wiring substrate 20, a waterproof layer 30, and a second wiring substrate 40.

The first wiring substrate 20 comprises a flexible first base layer 11 having a first copper layer 12 and a first conductive wiring layer 14 formed on the opposite surfaces of the first base layer 11. The first conductive wiring layer 14 comprises a signal wire 141 and a ground wires 142 on two sides of the signal wire 141.

The first base layer 11 can be made of a material selected from a group consisting of polymide (PI), liquid crystal polymer (LCP), polyether-ether-ketone (PEEK), polyethylene terephthalate (PET), and polyethylene naphthalate (PEN).

In one embodiment, the first base layer 11 is made of polymide.

The first wiring substrate 20 defines at least one second conductive portion 15, which extends through the first copper layer 12 and the first base layer 11. The second conductive portion 15 electrically connects the first copper layer 12 and the first conductive wiring layer 14. In one embodiment, the second conductive portion 15 electrically connects the first copper layer 12 and the ground wire 142. The second conductive portion 17 is made of a first conductive material, which can be conductive paste such as tin paste, or metal such as copper. An end of the second conductive portion 15 away from the first conductive wiring layer 14 protrudes out of the first copper layer 12.

The waterproof layer 30 covers the first base layer 11, the first copper layer 12, the first conductive wiring layer 14, and the second conductive portion 15. In an alternative embodiment, the waterproof layer 30 only covers exposed surfaces of the first conductive wiring layer 14, thereby protecting the first conductive wiring layer 14 from moisture.

In other alternative embodiment, the waterproof layer 30 can further cover exposed surfaces of the first base layer 11, the first copper layer 12, and the second conductive portion 15.

The waterproof layer 30 is a nanometer-scale film, for example, which is made of a low viscosity solution containing 4% weight percent of fluorinated polymer dissolved in a hydrofluoroether solvent and detectable by ultraviolet light. In an alternative embodiment, a thickness of the waterproof layer 30 is about 180 nm to 360 nm.

The second wiring substrate 40 comprises a second copper layer 41, a first insulation layer 42, an adhesive layer 43, and a wiring unit 44 stacked in that order. The wiring unit 44 comprises a second conductive wiring layer 441 stacked on the adhesive layer 43, a second insulation layer 442, and a third conductive wiring layer 443 stacked in that order. The wiring unit 44 defines a receiving groove 45 extending through the third conductive wiring layer 443, the second insulation layer 442, and the second conductive wiring layer 441. The adhesive layer 43 is exposed at the receiving groove 45.

In an alternative embodiment, the quantity of the conductive wiring layers of the wiring unit 44 can be changed according to actual needs.

The first wiring substrate 20 is received in the receiving groove 45 and is adhered to the second wiring substrate 40 via the adhesive layer 43. The first copper layer 12 is aligned with the third conductive wiring layer 443, the adhesive layer 43 also fills gaps between the second insulation layer 442 and the first base layer 11.

The adhesive layer 41 is made of a sticky resin, which can be selected from a group consisting of polypropylene, epoxy resin, polyurethane, phenolic resin, urea-formaldehyde resin, melamine-formaldehyde resin, polymid, and any combination thereof. The first insulation layer 42 and the second insulation layer 442 can be made of a material selected from a group consisting of polymide (PI), liquid crystal polymer (LCP), polyether-ether-ketone (PEEK), polyethylene terephthalate (PET), and polyethylene naphthalate (PEN).

In one embodiment, the first insulation layer 42 and the second insulation layer 442 are made of polymide.

The second wiring substrate 40 defines at least one first conductive portion 46, which extends through the second copper layer 41, the first insulation layer 42, the adhesive layer 43, and a portion of the waterproof layer 30 on a side of the first conductive wiring layer 14 away from the first base layer 11. The first conductive portion 46 electrically connects the first conductive wiring layer 14 and the second copper layer 41. In one embodiment, the first conductive portions 46 electrically connects the second copper layer 41 and the ground wire 142. The first conductive portion 46 is made of a second conductive material, which can be conductive paste such as tin paste, or metal such as copper. An end of the first conductive portion 46 away from the adhesive layer 43 protrudes out of the second copper layer 41.

The first conductive portion 46 and the second conductive portion 15 are both electrically connected to the ground wires 142, thus the copper layer 12, the first conductive portion 46, the second conductive portion 15, and the second copper layer 41 cooperatively form an electromagnetic shield 47. The signal wire 141 is within the electromagnetic shield 47, thereby being shielded against electromagnetic interference.

The waterproof circuit board 100 further comprises a first protection layer 50 and a second protection layer 51. The first protection layer 50 is formed on a surface of a portion of the waterproof layer 30, which is on a side of the first copper layer 12 away from the first base layer 11, and a surface of the third conductive wiring layer 443. The second protection layer 51 is formed on a surface of the second copper layer 41 away from the adhesive layer 43. The first protection layer 50 also fills gaps between the second insulation layer 442 and the first base layer 11. The first protection layer 50 and the second protection layer 51 can be solder masks or covering layers.

A portion of the second copper layer 41 is exposed from the second protection layer 51 to form at least one solder pad 511.

The configuration of the waterproof layer 30 covering exposed surfaces of the first conductive wiring layer 14 protects the circuit board 100 from moisture during manufacturing and in use, thus radio-frequency performance will be stable and not affected by moisture absorption. The first wiring substrate 20 is made of materials suitable for high frequency radio transmissions. The second wiring substrate 40 is not made of such materials. Compared with a common circuit board all made of such materials, the waterproof circuit board 100 is obtained by embedding at least one first wiring substrate 20 made of such materials into the second wiring substrate 40, thus a production cost is lowered.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A waterproof circuit board comprising:
  a first wiring substrate, the first wiring substrate comprising a first base layer comprising opposite surfaces, a first copper layer and a first conductive wiring layer being formed on the opposite surfaces, the first copper layer being electrically coupled to the first conductive wiring layer;
  a waterproof layer covering exposed surfaces of the first conductive wiring layer, the first base layer, and the first copper layer; and
  a second wiring substrate comprising a second copper layer, a first insulation layer, an adhesive layer, and a wiring unit stacked in said order, the wiring unit defining a receiving groove from which the adhesive layer is exposed;
  wherein the first wiring substrate is received in the receiving groove and is adhered to the second wiring substrate via the adhesive layer, the second wiring substrate defines at least one first conductive portion extending through the second copper layer, the first insulation layer, the adhesive layer, and a portion of the waterproof layer on a side of the first conductive wiring layer away from the first base layer, each of the at least one first conductive portion electrically connects the first conductive wiring layer and the second copper layer.

2. The waterproof circuit board of claim 1, wherein the first wiring substrate defines at least one second conductive portion extending through the first copper layer and the first base layer, each of the at least one second conductive portion electrically connects the first copper layer and the first conductive wiring layer.

3. The waterproof circuit board of claim 2, wherein the first conductive wiring layer comprises a signal wire and a ground wire on two sides of the signal wire, each of the first and second conductive portions is electrically connected to the ground wire, the first copper layer, the first conductive portion, the second conductive portion, and the second copper layer cooperatively form an electromagnetic shield, the signal wire is within the electromagnetic shield.

4. The waterproof circuit board of claim 2, wherein an end of the second conductive portion away from the first conductive wiring layer protrudes out of the first copper layer, the waterproof layer further covers exposed surfaces of the second conductive portion.

5. The waterproof circuit board of claim 1, wherein the wiring unit comprises a second conductive wiring layer on the adhesive layer, a second insulation layer, and a third conductive wiring layer stacked in said order, the receiving groove extends through the third conductive wiring layer, the second insulation layer, and the second conductive wiring layer.

6. The waterproof circuit board of claim 5, wherein the first copper layer is aligned with the third conductive wiring layer, the adhesive layer fills gaps between the second insulation layer and the first base layer.

7. The waterproof circuit board of claim 5, further comprising a first protection layer, wherein the first protection layer is formed on a surface of the third conductive wiring layer and a surface of a portion of the waterproof layer which is on a side of the first copper layer away from the first base layer.

8. The waterproof circuit board of claim 7, wherein the first protection layer fills gaps between the second insulation layer and the first base layer.

9. The waterproof circuit board of claim 1, further comprising a second protection layer on a surface of the second copper layer away from the adhesive layer.

10. The waterproof circuit board of claim 1, wherein a thickness of the waterproof layer is 180 nm to 360 nm.

11. A method for manufacturing a waterproof circuit board comprising:
providing a first wiring substrate, the first wiring substrate comprising a first base layer comprising opposite surfaces, a first copper layer and a first conductive wiring layer being formed on the opposite surfaces, the first copper layer being electrically coupled to the first conductive wiring layer;
forming a waterproof layer on surfaces of the first wiring substrate, the waterproof layer covering exposed surfaces of the first conductive wiring layer, the first base layer, and the first copper layer;
providing a second wiring substrate, the second wiring substrate comprising a second copper layer, a first insulation layer, an adhesive layer, and a wiring unit stacked in said order, the wiring unit defining a receiving groove from which the adhesive layer is exposed;
placing and pressing the first wiring substrate in the receiving groove, the first wiring substrate being adhered to the second wiring substrate via the adhesive layer;
defining at least one first blind hole on the second wiring substrate, each of the at least one first blind hole extending through the second copper layer, the first insulation layer, the adhesive layer, and a portion of the waterproof layer on a side of the first conductive wiring layer away from the first base layer; and forming a first conductive portion in each of the at least one first blind hole, the first conductive portion electrically connecting the first conductive wiring layer and the second copper layer.

12. The method of claim 11, wherein providing a first wiring substrate comprises:
providing a copper-clade substrate, the copper-clade substrate comprising the first base layer comprising opposite surfaces, the first copper layer and a third copper layer being formed on the opposite surfaces;
etching the third copper layer to form the first conductive wiring layer;
defining at least one second blind hole on the copper-clade substrate, each of the at least one second blind hole extending through the first copper layer and the first base layer; and
forming a second conductive portion in each of the at least one second blind hole, the second conductive portion electrically connecting the first copper layer and the first conductive wiring layer.

13. The method of claim 12, wherein the first conductive wiring layer comprises a signal wire and a ground wire on two sides of the signal wire, each of the first and the second conductive portions is electrically connected to the ground wire, the first copper layer, the first conductive portion, the second conductive portion, and the second copper layer cooperatively form an electromagnetic shield, the signal wire is within the electromagnetic shield.

14. The method of claim 12, wherein an end of the second conductive portion away from the first conductive wiring layer protrudes out of the first copper layer, the waterproof layer further covers exposed surfaces of the second conductive portion.

15. The method of claim 11, wherein the wiring unit comprises a second conductive wiring layer on the adhesive layer, a second insulation layer, and a third conductive wiring layer stacked in said order, the receiving groove extends through the third conductive wiring layer, the second insulation layer, and the second conductive wiring layer.

16. The method of claim 15, wherein after pressing the first wiring substrate, the method further comprising aligning the first copper layer with the third conductive wiring layer, and filling the adhesive layer into gaps between the second insulation layer and the first base layer.

17. The method of claim 15, further comprising:
forming a first protection layer on a surface of a portion of the waterproof layer which is on a side of the first copper layer away from the base layer, and a surface of the third conductive wiring layer, the first protection layer filling gaps between the second insulation layer and the first base layer.

18. The method of claim 11, further comprising:
forming a second protection layer on a surface of the second copper layer away from the adhesive layer.

19. The method of claim 11, wherein a thickness of the waterproof layer is 180 nm to 360 nm.

* * * * *